United States Patent [19]
Zhao et al.

[11] Patent Number: 5,962,856
[45] Date of Patent: Oct. 5, 1999

[54] ACTIVE MATRIX X-RAY IMAGING ARRAY

[75] Inventors: Wei Zhao; John Rowlands, both of Toronto, Canada

[73] Assignee: Sunnybrook Hospital, North York, Canada

[21] Appl. No.: 08/952,325

[22] PCT Filed: Apr. 28, 1995

[86] PCT No.: PCT/CA95/00247

§ 371 Date: Apr. 6, 1998

§ 102(e) Date: Apr. 6, 1998

[87] PCT Pub. No.: WO96/34416

PCT Pub. Date: Oct. 31, 1996

[51] Int. Cl.$^6$ .................................................. H01L 29/78
[52] U.S. Cl. .................... 250/370.09; 250/370.02
[58] Field of Search ........................... 250/370.09, 370.02

[56] References Cited

U.S. PATENT DOCUMENTS

| | | |
|---|---|---|
| 5,150,393 | 9/1992 | Aichinger et al. . |
| 5,355,013 | 10/1994 | Parker ..................................... 257/458 |
| 5,396,072 | 3/1995 | Schiebel et al. . |

FOREIGN PATENT DOCUMENTS

| | | |
|---|---|---|
| 0 365 294 A3 | 4/1990 | European Pat. Off. . |
| 59-040581 | 3/1984 | Japan . |

OTHER PUBLICATIONS

D.M. Korn, et al., "A Method of Electronic Readout of Electrophotgraphic and Electroradiographic Images," *Journal of Applied Photgraphic Engineering* (Fall 1978), vol. 4, No. 4, pp. 178–182.

A. Zermeno, et al., "Laser Readout of Electrostatic Images," *Application of Optical Instrumentation in Medicine* (1979), vol. 173, pp. 81–87.

H. deMonts, et al., "A new photconductor imaging system for digital radiography," *Am. Assoc. Phys. Med.* (1989), vol. 16, No. 1, pp. 105–109.

L. E. Antonuk, et al., "Signal, noise, and readout considerations in the development of amorphous silicon photodiode arrays for radiotherapy and diagnostic x–ray imaging," *Medical Imaging V: Image Physics* (1991) vol. 1443, pp. 108–119.

L. E. Antonuk, et al., "A High Resolution, High Frame Rate, Flat–Panel TFT Array for Digital X–Ray Imaging," *Physics of Medical Imaging* (1994) vol. 2163, pp. 118–128.

(List continued on next page.)

*Primary Examiner*—Constantine Hannaher
*Assistant Examiner*—Andrew Israel
*Attorney, Agent, or Firm*—Fay, Sharpe, Beall, Fagan, Minnich & McKee, LLP

[57] ABSTRACT

A digital detector for radiography and fluoroscopy is disclosed. The detector includes a large area, flat panel that easily fits into a conventional X-ray room bucky tray. The detector utilizes a layer of photoconductor (i.e. a-Se in the preferred embodiment) to detect X-rays and convert the X-ray energy to charge, and an active matrix TFT array in the form of a very large area integrated circuit, for readout of the charge. A dual gate structure is used for the TFT array wherein the top gate is formed as an extension of the pixel electrode, so as to provide high voltage protection of the TFT. An integrated pixel storage capacitor is provided for enhanced absorption of X-ray energy with low pixel voltage, low leakage current and a large charge leakage time constant. In a preferred embodiment, the integrated pixel storage capacitor is created by overlapping the pixel the pixel electrode with an adjacent gate line or a separate ground line of the active matrix readout array. Image charge collection efficiency is enhanced by manipulating the electric field distribution in the photoconductor layer so that image charges land on the pixel electrodes, and not on the TFT readout devices.

18 Claims, 9 Drawing Sheets

OTHER PUBLICATIONS

L. E. Antonuk, et al., "Demonstration of megavoltage and diagnostic x-ray imaging with hydrogenated amorphous silicon arrays," *Am. Assoc. Phys. Med.* (1992) vol. 19, No. 6, pp. 1455–1466.

I. Fudieda, et al., "High Sensitivity Readout of 2D a–Si Image Sensors," *Jpn. J. App. Phys.* (Jan. 1993) vol. 32, pp. 198–204.

H. Rougeot, "Direct X–Ray Photconversion Processes," pp. 51–96.

U. Schiebel, et al., "Fluoroscopic X–Ray Imaging with Amorphous Silicon Thin–Film Arrays," *Physics of Medical Imaging* (1994) vol. 2163, pp. 129–140.

M. J. Powell, et al., "Amorphous Silicon Image Sensor Arrays," Mat. Res. Soc. Symp. Proc. (1992) vol. 258, pp. 1126–1137.

W. Zhao, et al., "Digital Radiology Using Self–Scanned Readout of Amorphous Selenium," *Physics of Medical Imaging* (1993) vol. 1896, pp. 114–120.

ACTIVE MATRIX X-RAY IMAGING ARRAY

FIELD OF THE INVENTION

This invention relates in general to medical diagnostic imaging systems, and more particularly to a selenium active matrix universal readout array imager.

BACKGROUND OF THE INVENTION

Despite the development of recent medical imaging modalities, such as computed tomography (CT), ultrasound, nuclear medicine and magnetic resonance imaging (MRI), all of which are digital, X-ray imaging systems remain an important tool for medical diagnosis. Although the majority of X-ray imaging systems in current use are of analog design, digital radiology is an area of considerable recent growth. Digital radiology provides significant advantages over its analog counter-part, such as: easy comparison of radiological images with those obtained from other imaging modalities; the ability to provide image networking within a hospital for remote access and archiving; facilitating computer aided diagnosis by radiologists; and facilitating teleradiology (ie. remote diagnostic service to poorly populated regions from a central facility).

There are currently two commercial approaches to digital radiography—(1) the digitization of a signal from a video camera optically coupled to a an X-ray imaging intensifier, and (2) stimulable phosphor systems. Prior art intensifier systems permit instant readout whereas prior art stimulable phosphor systems require the operator to carry a cassette to a reader. Neither of these systems provide image quality which is acceptable for all applications.

Digital systems based on the use of X-ray image intensifiers suffer from the following disadvantages: the bulky nature of the intensifier often impedes the clinician by limiting access to the patient and prevents the acquisition of important radiographic views; loss of image contrast due to X-ray and light scattering (i.e. veiling glare); and geometric (pin cushion) distortion on the image due principally to the curved input phosphor.

Another prior art X-ray imaging modality which is currently experiencing renewed interest, is the use of amorphous selenium photoconductors as an alternative to phosphors. Xeroradiography, (i.e. the use of amorphous selenium (a-Se) plates which are read out with toner), was a technical and commercial success in the early 1970's. Xeroradiography is no longer commercially competitive. This is believed to be because of the toner readout method, and not because of the underlying properties of a-Se. Commercial as well as scientific interest in a-Se has recently revived. For example, Philips has announced the commercial availability of an a-Se drum scanner for chest radiography based on earlier work at its research laboratories in Aachen. Kodak uses an a-Se plate readout with a phosphor coated toner and laser scanner for the preparation of highly detailed mammography images which are free from significant artifacts. 3M have also published preliminary descriptions of their work on laser discharge readout of a-Se. This work is related to much earlier publications by (1) Korn et al, "A method of electronic readout of electrophotographic and electroradiographic images", Journal of Applied Photographic Engineering, 4, 178–182 (1978); (2) Zermeno et al "Laser readout of electrostatic images", In: Application of Optical Instrumentation to Medicine VII, Edited by J. Gray, et al, SPIE 173, 81–87 (1979); and (3) DeMonts et al, "A new photoconductor imaging system for digital radiography", Medical Physics, 16, 105–109 (1989).

The basis of all existing medical X-ray imaging systems is a phosphor layer or "screen". X-rays absorbed by the screen release light which must reach the surface to create an image. The lateral spread of light is limited only by diffusion and hence is related to the thickness of the screen. Thus, the thicker the screen (which is desirable to increase the quantum absorption efficiency), the more blurry the image will be. This represents a loss of high frequency image information in prior art phosphor systems which is fundamental and largely irreversible. This loss can be alleviated to some extent by using a phosphor such as CsI which can be grown in the form of a fibre optic.

A better method has been discovered for eliminating blurring, which involves using a structureless photoconductor to detect X-rays. X-rays interacting in the photoconductor release electron-hole pairs which are drawn directly to the surfaces of the photoconductor by an applied electric field. The latent charge image on the photoconductor surface is therefore not blurred significantly even if the photoconductor layer is made thick enough to absorb most incident X-rays. Amorphous selenium (a-Se) is the most highly developed photoconductor for X-ray applications. Its amorphous state maintains uniform characteristics to very fine levels over large areas. A large area detector is essential in radiography since no means are provided to focus the X-rays, thereby necessitating a shadow X-ray image which is larger than the body part to be imaged.

One area of intense research in the field of photoconductor X-ray detectors, is the development of systems for charge readout. Antonuk et al disclosed the concept of an X-ray imaging detector which utilizes active matrix arrays for charge readout, as described in the following publications: (1) "Signal, noise, and readout considerations in the development of amorphous silicon photodiode arrays for radiotherapy and diagnostic imaging", Medical Imaging V: Imaging Physics, SPIE 1443, 108–119 (1991), (2) "High resolution, high frame rate, flat panel TFT arrays for digital X-ray imaging", Medical Imaging 1994: Physics of Medical Imaging, Rodney Shaw, Editor, Proceedings of SPIE, 2163, 118–128 (1994) and (3) "Demonstration of megavoltage and diagnostic X-ray imaging with hydrogenated amorphous silicon arrays", Medical Physics 19, 1455–1466 (1992). Their initial research has subsequently been developed by others: Ichiro Fujieda, Robert A. Street, Richard L. Weisfield, Steve Nelson, Per Nylen, Victor Perez-Mendez and Gyuseong Cho, "High sensitivity readout of 2d a-Si image sensors", Jpn. J. Appl. Phys. 32, 198–204 (1993); Henri Rougeot, "Direct X-ray photoconversion processes", In: Digital imaging: AAPM 1993 Summer School Proceedings Ed: William Hendee and Jon Trueblood (AAPM monograph 22, Medical Physics Publishing, 1993) pp. 49–96; UW Schiebel, N Conrads, N Jung, M Weilbrecht, H Wieczorek, T T Zaengel, M J Powell, I D French and C Glasse "Fluoroscopic X-ray imaging with amorphous silicon thin-film arrays", Medical Imaging 1994: Physics of Medical Imaging, Rodney Shaw, Editor, Proc. SPIE, 2163, 129–140 (1994); and M J Powell, I D French, J R Hughes, N C Bird, O S Davies C Glasse and J E Curran, "Amorphous silicon image sensor arrays", Mat. Res. Soc. Symp. Proc. 258, 1127–1137 (1992).

In these prior art systems a phosphor screen (preferably a structured CsI layer) is used to absorb X-rays, and the resultant light photons are detected by an active matrix array with a single photodiode and transistor at each pixel. Antonuk coined the acronym MASDA for "Multi-element Amorphous Silicon Detector Array".

SUMMARY OF THE INVENTION

According to the present invention, a digital detector is provided which performs all of the currently available radiological modalities, radiography (including rapid sequence radiography) and fluoroscopy. The detector comprises a large area, flat panel which easily fits into the conventional X-ray room bucky tray. The detector utilizes a layer of photoconductor (ie. a-Se in the preferred embodiment) to detect X-rays and convert the X-ray energy to charge, and an active matrix TFT array in the form of a very large area integrated circuit, for readout of the charge. The broad concepts which led to this invention are disclosed in the following article: W. Zhao and J. A. Rowlands, "Digital Radiology Using Self-Scanned Readout of Amorphous Selenium", in Medical Imaging VII: Physics of Medical Imaging, SPIE 1896, 114–120 (1993). However, certain inventive aspects of implementation of the device are not disclosed in this prior article and form the basis of the present application.

According to one aspect of the present invention, a dual gate structure is utilized for providing high voltage protection of the TFTs. The additional gate is formed as an extension of the pixel electrode, and overlies a predetermined thickness of dielectric over the semiconductor channel. When excessive charge is collected by the electrode, the TFT turns ON so that a high leakage current drains away the excess charge on the pixel electrode.

According to a further aspect of the invention, an integrated pixel storage capacitor is provided for enhanced absorption of X-ray energy with low pixel voltage, low leakage current and hence a large charge leakage time constant. In the preferred embodiment, the integrated pixel storage capacitor is created by overlapping the pixel electrode with an adjacent gate line or a separate ground line of the active matrix readout array.

According to another aspect of the invention, image charge collection efficiency is improved by manipulating the electric field distribution in the photoconductor layer so that image charges land on the pixel electrodes, and not on the TFT readout devices.

According to yet another aspect of the invention, a photo-timer is integrated into the imaging detector for measuring X-ray exposure.

As discussed in greater detail below, because an electrostatic X-ray image transducer is utilized, the system of the preferred embodiment provides higher resolution images than phosphor based systems, even those using structured CsI. The signal-to-noise ratio of the prior art MASDA system and the system of the preferred embodiment are essentially identical since the X-ray-to-charge conversion gain is the same for both (assuming CsI and a-Si:H for MASDA and a-Se for the system of the preferred embodiment). Thus, the overall image quality of the system according to the present invention is believed to be considerably better than that produced using the prior MASDA device.

Furthermore, the requirements for manufacture of the system of the preferred embodiment are favourable when compared to the prior art MASDA system. Firstly, MASDA requires a CsI structure which is more difficult in principle to manufacture than a uniform layer of a-Se. Secondly, because X-rays are converted directly to electrons by a-Se, the need for photodiodes at each pixel is eliminated and the active matrix array can be simplified. This leads to further simplifications in the system of the present invention, as compared to the prior art MASDA device, thereby resulting in more economical manufacturing.

These and other aspects of the invention are described in greater detail below.

BRIEF DESCRIPTION OF THE DRAWINGS

A detailed description of the preferred embodiment is provided below with reference to the following drawings, in which.

DETAILED DESCRIPTION OF THE PREFERRED EMBODIMENT

Figure 1A:
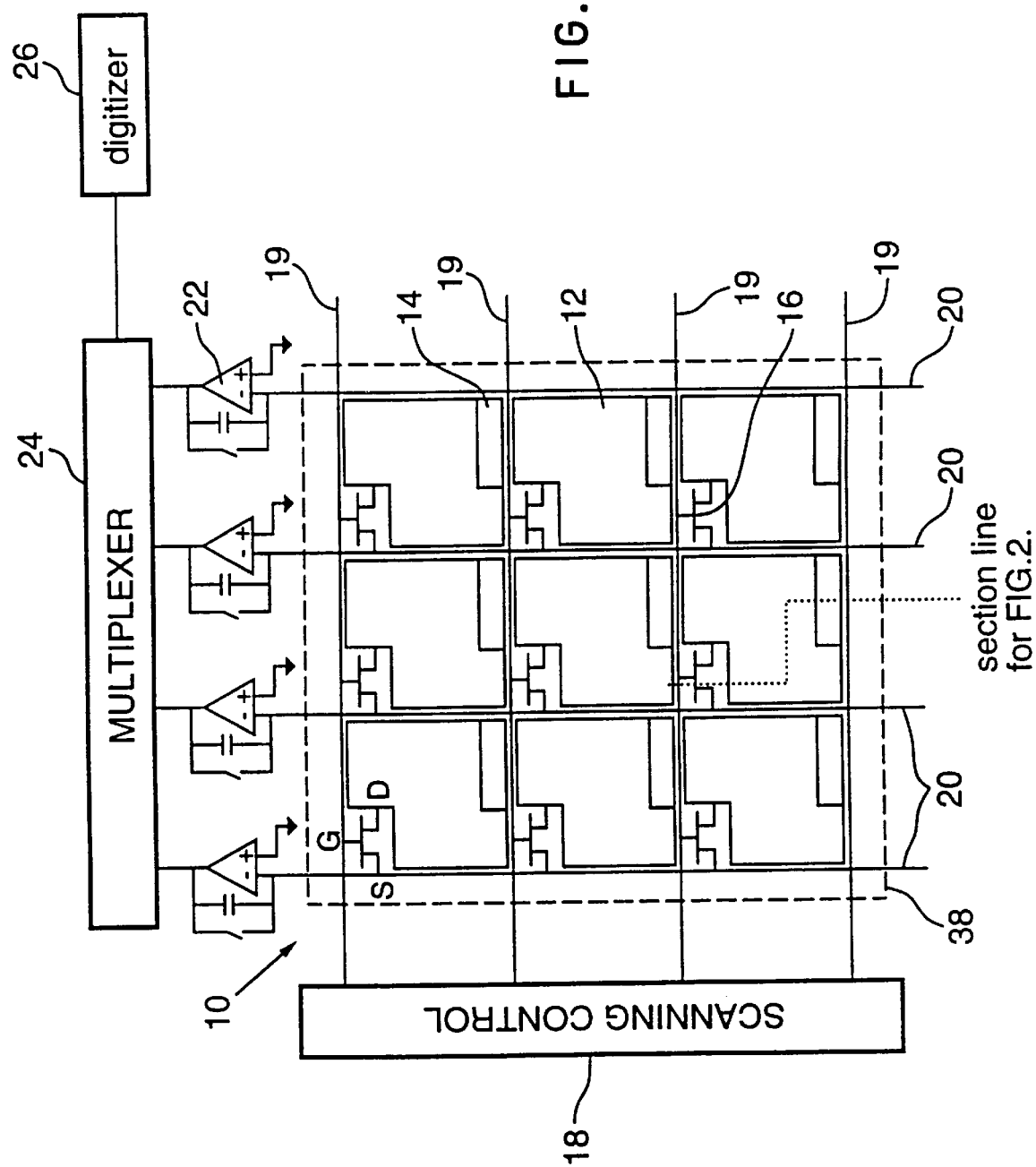
FIG. 1A is a schematic plan view of the imaging arraying to the preferred embodiment.
Figure 1B:
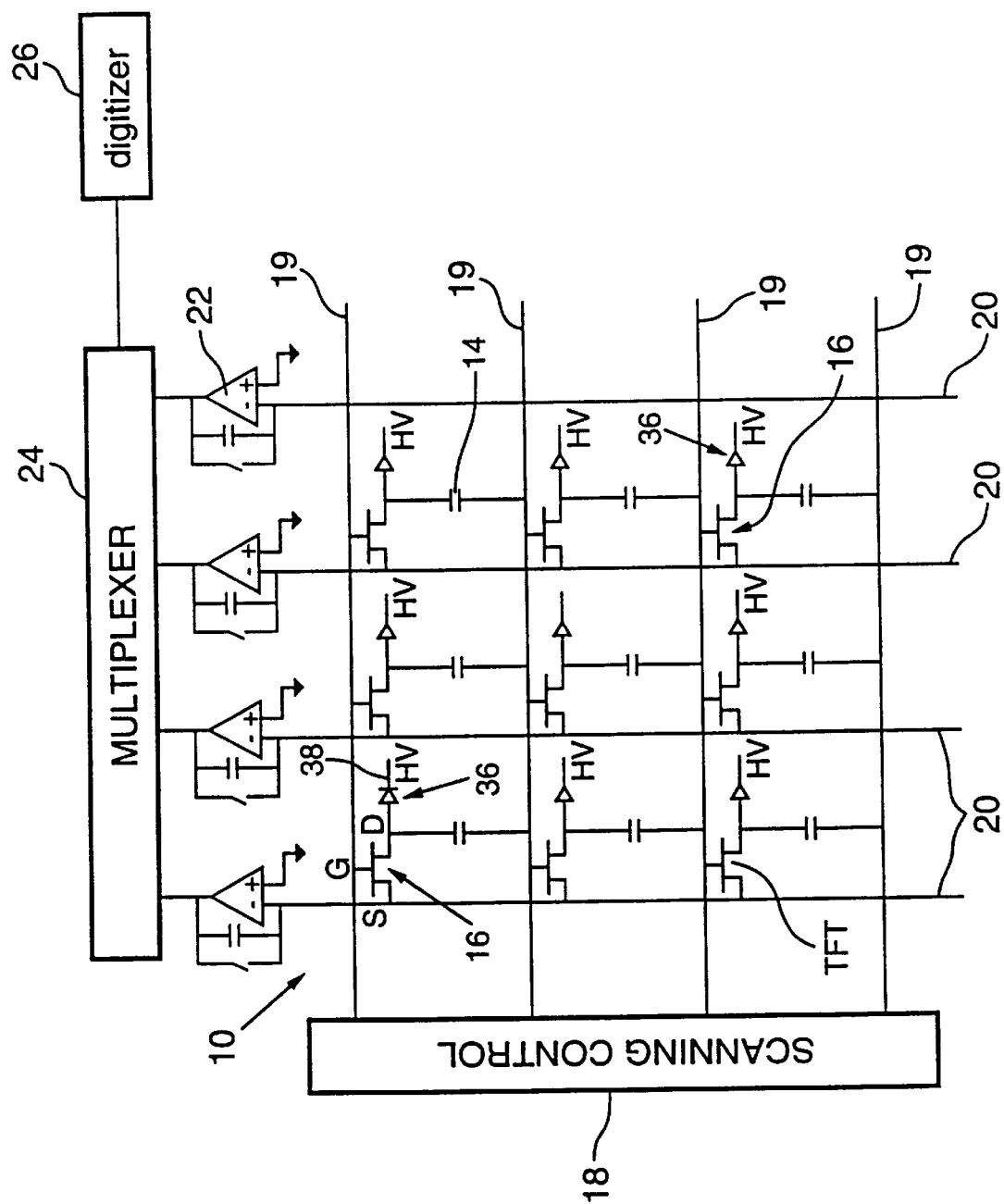
FIG. 1B is an equivalent circuit for the imaging array of FIG. 1A.

With reference to FIG. 1, an active matrix 10 is shown comprising a plurality of pixels, each comprising a pixel electrode 12, storage capacitor 14 and thin film transistor (TFT) 16. An external scanning control circuit 18 turns on the TFTs 16 one row at a time via a plurality of control lines 19, for transferring the image charge from the pixels to a plurality of data lines 20, and then to respective external charge amplifiers 22. At the same time, the input (virtual ground) of the charge amplifiers 22 resets the potential at each pixel electrode 12. The resulting amplified signal for each row is multiplexed by a parallel-to-serial converter or multiplexer 24, and then transmitted to an analog-to-digital converter or digitizer 26.

Each TFT 16 comprises 3 electrical connections: the drain (D) is connected to the pixel electrode 12 and pixel storage capacitor 14; the source (S) is connected to a common data line 20 shared by all TFTs of the same column, and also to an external charge sensitive amplifier 22; and the gate (G) is used for control of the "on" and "off" state of the TFT 16. Usually, 10 V and −5 V is applied to turn on and off the TFT 16 respectively.

The scanning control circuit 18 may be fabricated as a single crystal silicon integrated circuit which is wire bonded to the active matrix TFT array. The charge amplifiers 22 and multiplexer 24 may also be fabricated as a single crystal silicon integrated circuit which is wire bonded to the active matrix array.

Figure 2:
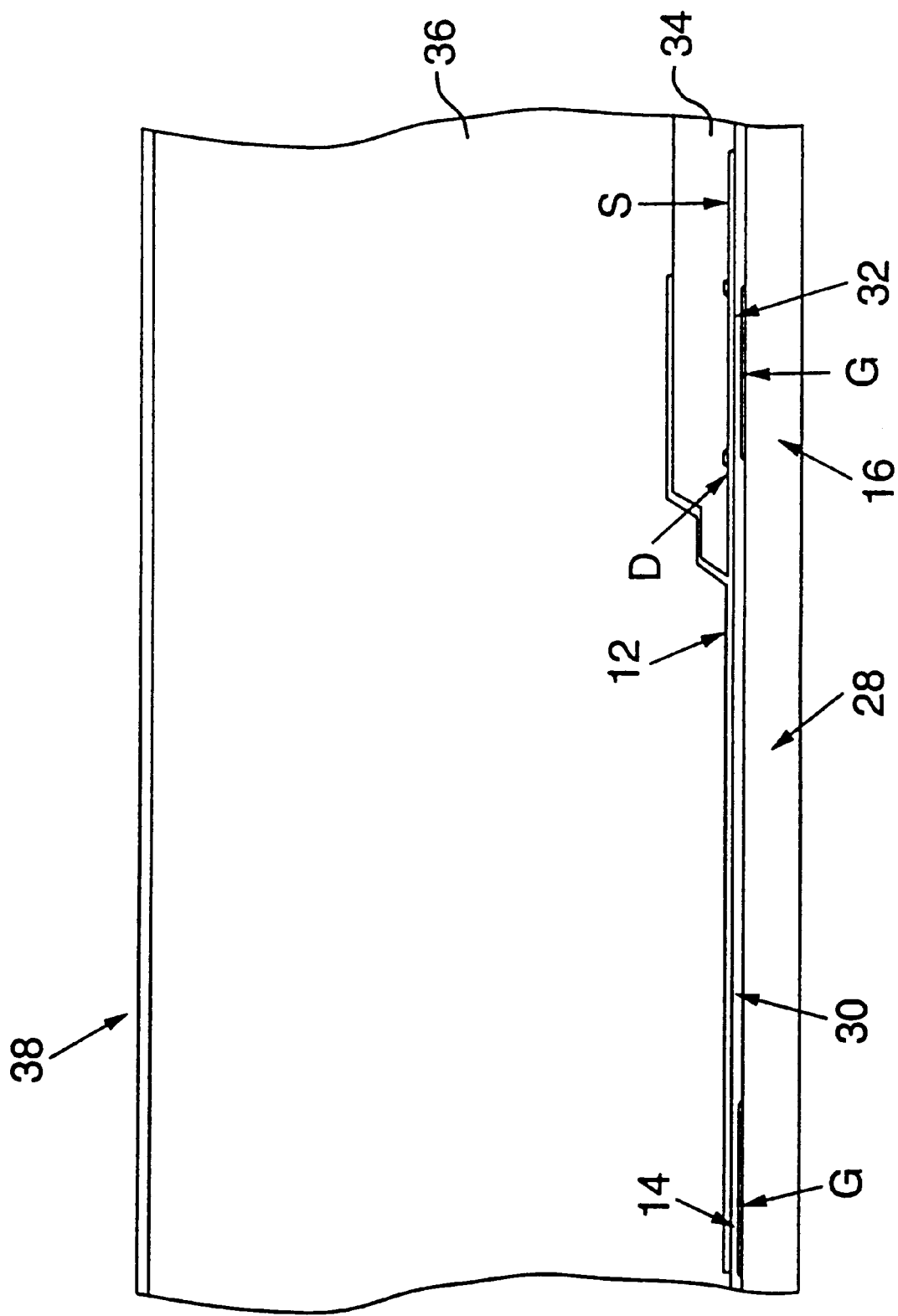
FIG. 2 is cross sectional view through a single pixel of the array shown in FIG. 1.

Turning now to FIG. 2, the structure of a single pixel is shown of the large area integrated circuit active matrix.

First, a metal layer (preferably Cr or Al) is deposited (by thermal evaporation or sputtering) on a glass substrate 28 and patterned using photolithography to form the gate regions (G) for the array of TFTS. As discussed in greater detail below, the gate line of an adjacent pixel may be extended so that the gate line and the pixel electrode 12 form an integrated pixel storage capacitor 14 with insulating layer 30 extending therebetween. Alternatively, separate ground return electrodes for storage capacitor may be formed between gate electrode lines on the first metal layer. The insulating layer 30 is deposited using PECVD (Plasma Enhanced Chemical Vapour Deposition) or thermal evaporation. The insulating material can be $SiO_2$, $Si_3N_4$, or alternate layers of both. The thickness of the layer is typically 0.1–0.5 μm.

Next, the drain (D) and source (S) metal layers are deposited (by thermal evaporation or sputtering) and patterned using photolithography to form drain and source contact pads for the TFT, the pixel electrodes and source (i.e. data) lines. The preferred material for the D and S contact pads is Cr, and an extra coating of Al is preferably added to the source lines to reduce the source line resistance. Next, a semiconductor layer 32, being several hundred angstroms thick, is deposited (e.g. using thermal evaporation or sputtering in the case of CdSe) and then patterned using photolithography to form the TFT channel (e.g. 30 μm wide and 50 μm long, although the illustrated TFT geometry represents only one possible embodiment of the invention).

The above-described deposition procedure is used for the drain, and source metal and semiconductor fabrication steps for a bottom D and S contact TFT structure. The two deposition steps can be reversed to form a top contact structure.

Next a dielectric layer 34 ($SiO_2$, $Si_3N_4$ or alternate layers of both) is deposited (using PECVD or thermal evaporation) with a thickness of 0.3–5 μm. Then, the dielectric on top of the pixel electrode is etched away to expose the pixel electrode.

The final top metal layer (preferably Al, or ITO) of the TFT is deposited using sputtering or thermal evaporation, and patterned using photolithography to form the pixel electrode 12 (which is the bottom pixel electrode since the dielectric in this region has been etched away). As discussed in greater detail below, according to the preferred embodiment, the pixel electrode 12 extends over the top gate dielectric layer 34 so as to form a dual gate TFT structure. A blocking layer may be formed by thermal oxidization the top metal (Al) layer for preventing negative charge injection from the pixel electrode to the X-ray photoconductor.

A uniform layer of X-ray sensitive photoconductor 36 is then directly deposited on the surface of the active matrix by thermal evaporation, to a thickness of approximately 500 μm. Preferably, the photoconductor is fabricated from amorphous selenium (a-Se).

A top bias electrode 38 is deposited (e.g. by thermal evaporation) onto the photoconductor layer 36 with appropriate blocking contact so that charge generated in the bulk of the photoconductor can flow to the bias electrode, with no charge injection from the bias electrode into the photoconductor. Several types of metal may form the blocking contact with selenium, such as Au, Indium, etc. An alternative embodiment is to deposit a thin layer (several hundred angstroms) of insulator (e.g. $CeO_2$) on the surface of the selenium before the bias electrode is deposited, wherein the thin insulating layer serves as a blocking layer.

Returning briefly to FIG. 1B, the selenium layer 36 and top bias electrode 38 are shown schematically as a photo-diode connected to a high bias voltage (HV) at the cathode of each pixel.

During X-ray irradiation, the X-ray energy is absorbed by the X-ray photoconductor 36 and electron-hole pairs are created. Under the applied electric field created by the difference in potential between bias electrode 38 and pixel electrode 12, the radiation generated charges are drawn to the surfaces of the photoconductor 36 and collected on pixel electrode 12. The difference in charge at each pixel represents the X-ray image.

As discussed above, the pixel electrode is connected to the drain (D) of the TFT 16. During each readout, the potential of the pixel electrode is reset, through the TFT, to a ground potential by the virtual ground input of the charge amplifier 22.

For fluoroscopy applications, a high voltage is constantly applied to the bias electrode 38 and the imaging detector is scanned in real time (i.e. 30 frames per second). The images are acquired continuously in every 1/30 second frame and are processed and displayed in real time.

For radiography applications, a high voltage is applied to the bias electrode 38 and the scanning is suspended (i.e. all TFTs 16 are turned off) during X-ray exposure. Scanning is resumed immediately after the exposure in order to readout the image.

For a-Se, the photoconductor layer 36 needs to be of a thickness in the order of 500 μm in order to absorb most of the incident X-rays. Thus, the bias voltage applied to electrode 38 must be in the order of 5000 volts under an electric field of 10 V/μm. Under abnormal conditions (e.g. a false prolonged X-ray exposure when all TFTs 16 are turned off), the potential on each pixel ($V_P$) can reach a damaging high value (e.g. 1000 volts).

The CdSe TFTs 16 of the preferred embodiment can maintain normal functions at $V_P$ up to approximately 200 volts. Thus, it is necessary to ensure that even under false, abnormal conditions, $V_P$ does not exceed 100 volts.

As discussed briefly above, and as shown with reference to FIG. 2, a dual gate structure is utilized to protect the TFT 16 from high voltage damage. In particular, the pixel electrode 12 (which is connected to the TFT drain (D)), extends over the top of the TFT 16 and acts as a second gate. The top gate voltage is equivalent to the pixel voltage (i.e. $V_{TG}=V_P$).

Figure 3:
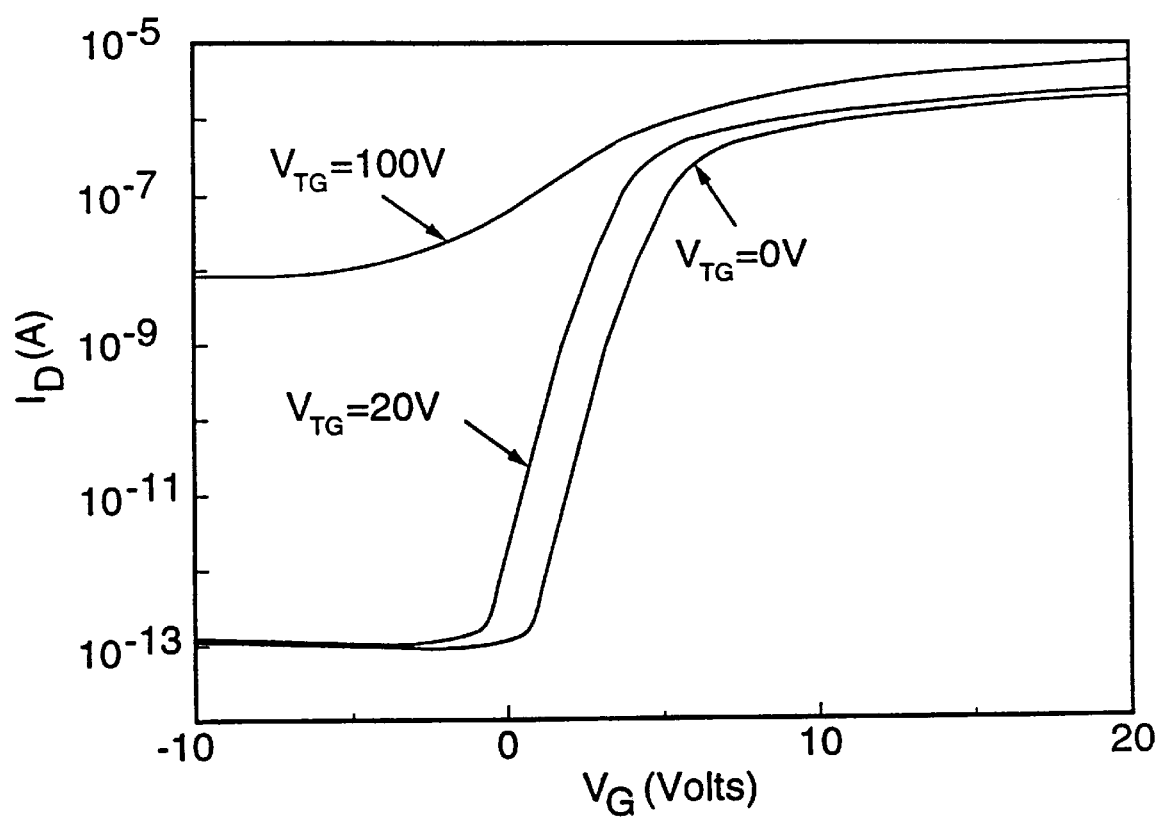
FIG. 3 shows the I-V characteristics of the high voltage protected TFT according to the present invention.

By adjusting the thickness of the top dielectric layer 34, the effect of $V_P$ on the transfer characteristics of the TFT 16, can be controlled. The top dielectric layer 34 is usually 5 to 10 times the thickness of the bottom gate dielectric layer for high voltage protection at a pixel potential of 100 volts. FIG. 3 shows the $I_D$–$V_G$ characteristic curve for a dual gate TFT at different values of $V_P$. Under normal imaging conditions (i.e. $V_P$<10 V), the bottom gate control pulse causes the TFT 16 to turn on and off correctly. However, if $V_P$ exceeds 100 volts, the bottom gate control pulse is no longer able to turn off TFT 16. In this case, the high leakage current drains away the excess charge on the pixel electrode 12 and $V_P$ never reaches a dangerously high potential.

The relationship between maximum pixel voltage $V_{P(max)}$ and dielectric thickness may be expressed as follows:

$$\frac{\epsilon_{it}}{d_{it}} = \frac{V_{th}}{V_{p(max)}} \times \frac{\epsilon_{ib}}{d_{ib}},$$

where $\epsilon_{it}$ is the dielectric constant of dielectric layer 34, $d_{it}$ is the thickness of dielectric layer 34, $V_{p(max)}$ is the maximum voltage to be applied to the pixel, $\epsilon_{ib}$ dielectric constant of the dielectric layer 30, and $d_{ib}$ is the thickness thereof. When $V_{G(off)}$ (usually −5 V) is applied to the bottom gate (G), it is desired that the TFT will nonetheless turn on when the voltage applied to pixel electrode 12 reaches $V_{p(max)}$. $V_{th}$ is a constant representing the minimum voltage which when applied to the bottom gate (G) will turn on the TFT when $V_p$=0. Thus for a dielectric layer 30 having a thickness in the range of 0.1 to 0.5 μm, a maximum pixel voltage of 100 volts, and the constant $V_{th}$ of 10 volts, the dielectric layer 34 will have a thickness of 1–5 μm, given the same dielectric as the dielectric layer 30.

Another consequence of making the photoconductor layer 36 thick to absorb as much X-ray energy as possible, is that a small sensor capacitance is created for each pixel (e.g. approximately 0.01 pF). This can result in three problems. Firstly, the pixel voltage $V_P$ on the drain (D) of the TFT 16 rises rapidly with the image charge (e.g. approximately 100 V/pC) because of the small pixel capacitance (i.e. the sum of the sensor capacitance $C_{Se}$ and the coupling capacitance between the gate and drain of the TFT ($C_{GD}$)), which in turn can cause high voltage damage to the TFTs 16 and the external electronics (e.g. scanning control circuit 18, charge amplifiers 22, multiplexer 24). Secondly, when each TFT 16 is turned off, charge injection to the pixel electrode 12 by the negative edge of the gate pulse output from scanning control circuit 18 (e.g. 15 volts), results in a negative potential on the pixel and thus a small forward bias between the gate (G) and drain (D). This can cause a significant increase in the leakage current for the TFT 16. Thirdly, the charge leakage time constant for each pixel $C_P \times R_{off}$ (approximately $10^{13}$ Ω) is 100 mS. For radiography applications, the pixels that are read out last will thus experience significant signal loss due to the short leakage time constant.

According to the preferred embodiment, an integrated pixel storage capacitance ($C_{ST}$) is provided on the TFT active matrix array, by overlapping the pixel electrode 12 with the gate line (G) of an adjacent pixel, as shown in FIG. 1 and in FIG. 2 on the left where storage capacitor 14 is formed by overlapping pixel electrode 12 with an extension of the gate line (G) of an adjacent pixel. As an alternative to overlapping the pixel electrode 12 with the adjacent gate line, a separate ground line may be utilized. A large pixel capacitance results from the thin insulating layer 30 (typically 0.1–0.5 μm), resulting in a storage capacitance $C_{ST}$ in the range of 0.5–1 pF, which is 20 times larger than $C_{GD}$, and two orders of magnitude larger than the capacitance of the photoconductor layer 36. The value of $C_{ST}$ is achieved by extending the pattern of the gate electrode (or a separate ground line), under the region of each pixel electrode 12 when the size of the pixel electrode is larger than 200 μm (e.g. for fluoroscopy and general radiography). For mammography applications, since the pixel size must be smaller (in the order of 50 μm), thinning of the insulator is needed in addition to extending the gate electrode.

The large integrated pixel storage capacitance $C_{ST}$ ensures, firstly, that the pixel voltage $V_P$ does not rise more than 2 V/pC with image charge, and thus does not reach a damagingly high potential under diagnostic X-ray exposure levels. Secondly, the voltage on the pixel electrodes returns to near ground potential after the TFTs 16 are turned off, thereby ensuring a low leakage current. Thirdly, the charge leakage time constant is approximately 10 seconds, and thus does not cause any significant signal loss for radiography applications.

Turning to FIG. 4, a cross sectional view, is provided similar to FIG. 2, through two adjacent pixels. However, the section of FIG. 2 extends through storage capacitor 14, while the section of FIG. 4 does not. According to the embodiment illustrated in FIG. 4, a plurality of parallel rails 40 are deposited as a grid adjacent the pixel electrodes 12, so as to overlay the source lines (S). Image charge collection efficiency in an active matrix sensor array, is controlled by the fill factor (i.e. the fraction of the area of each pixel that is occupied by the pixel electrode 12). The fill factor of a typical CdSe TFT array is approximately 80% for a 200 μm square pixel. Most of the remainder of each pixel is occupied by the source lines (S). By applying a potential on the grid 40 that is significantly higher than the pixel potential, the electric field distribution in the photoconductive layer 36 may be manipulated so that image charges only land on the pixel electrodes 12, and not on the source lines (S). As seen in FIG. 4, the field lines 42 may be caused to bend toward the pixel electrodes 12 and thus increase the effective fill factor. In practice, the potential applied to the grid 40 must be sufficient to cause a noticeable increase in charge collection efficiency of the pixel electrode 12 (e.g. typically in the order of several hundred volts).

Figure 4A:
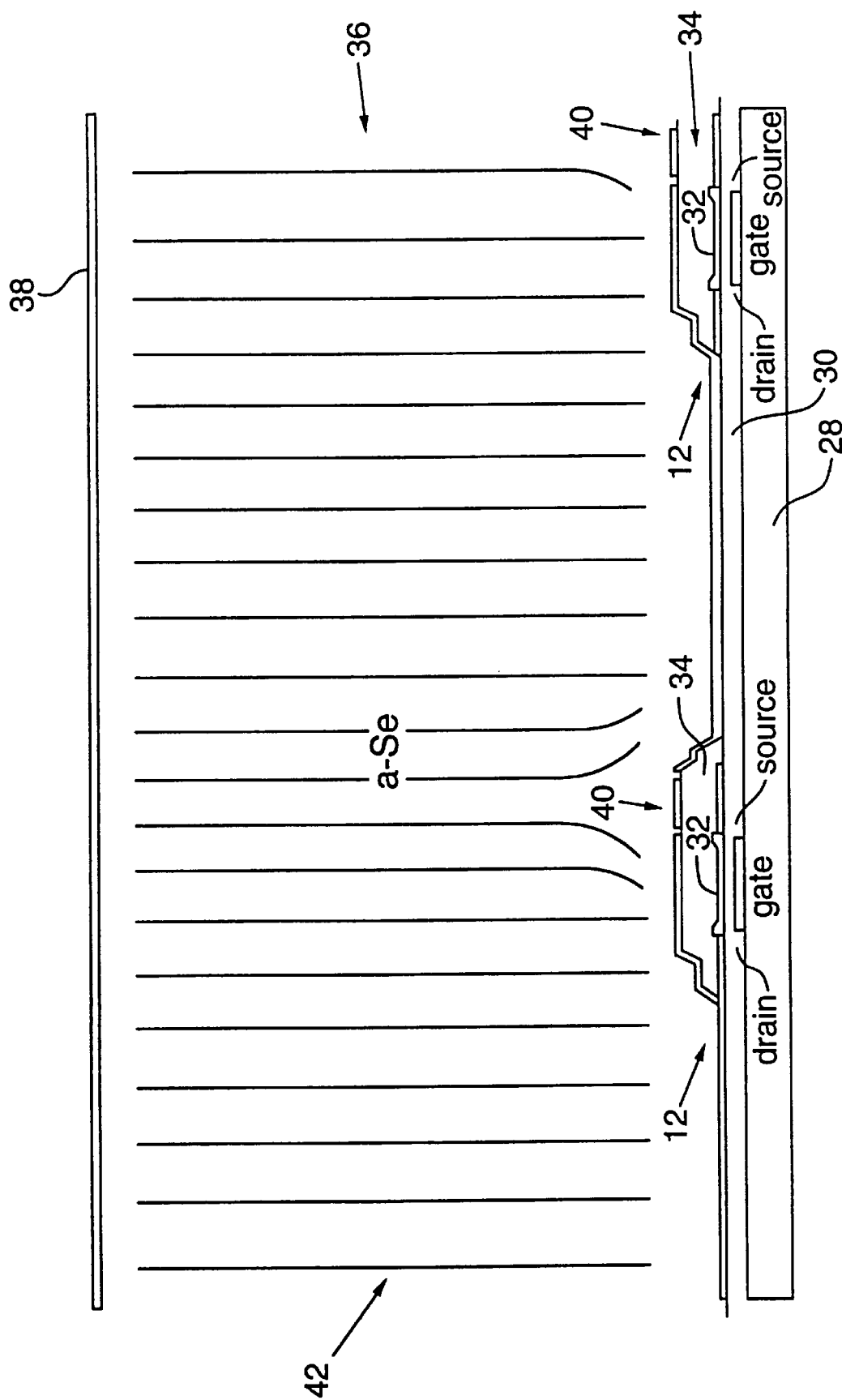
FIG. 4A is a cross sectional view through two pixels of the array shown in FIG. 1, illustrating improved fill factor by bending electric field lines using guard rails, in accordance with the preferred embodiment.
Figure 4B:
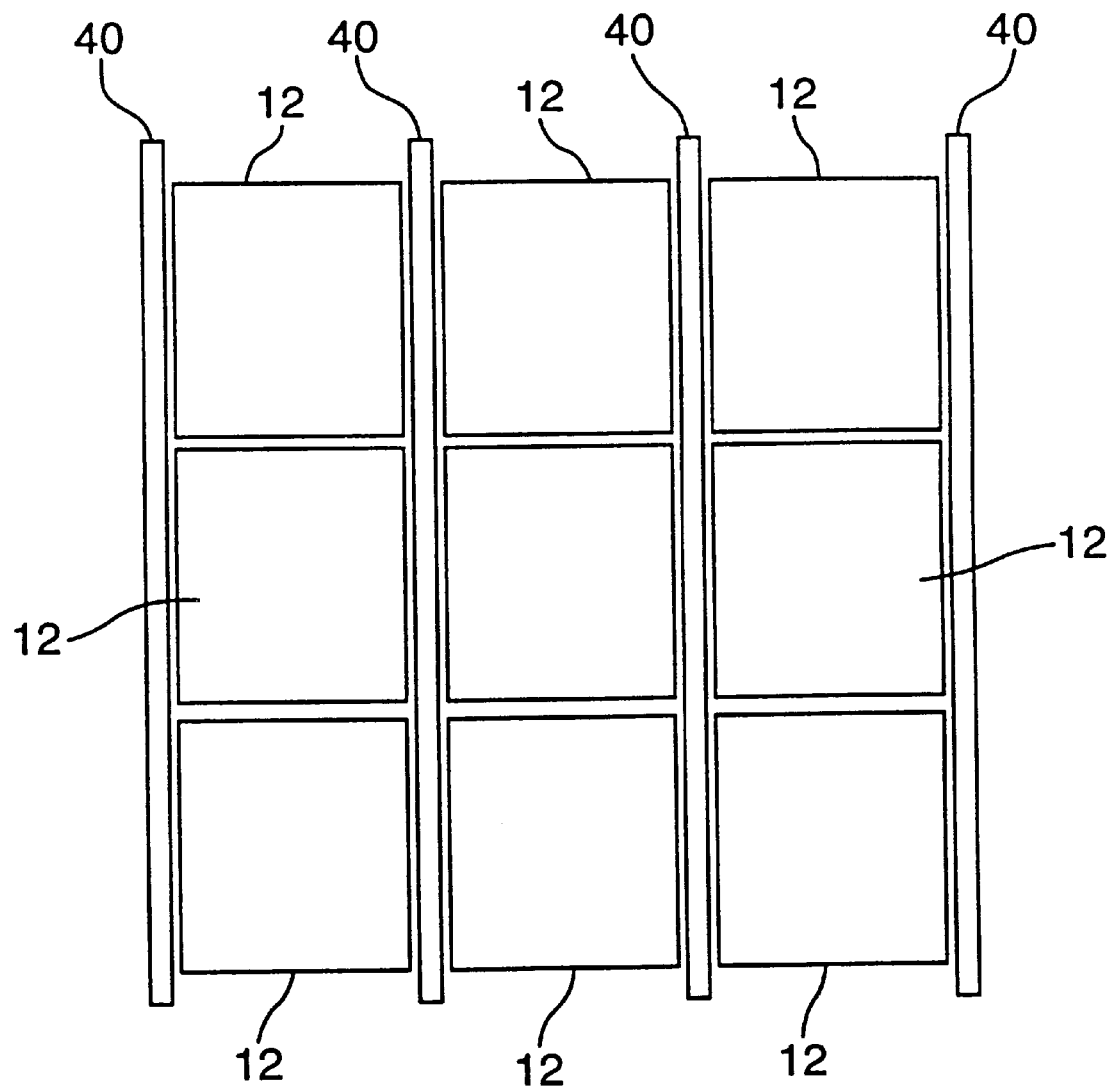
FIG. 4B is a plan view of the top layer of the array showing the disposition of the guard rails.

A plan view of the grid 40 is shown in FIG. 4B.

Figure 4C:
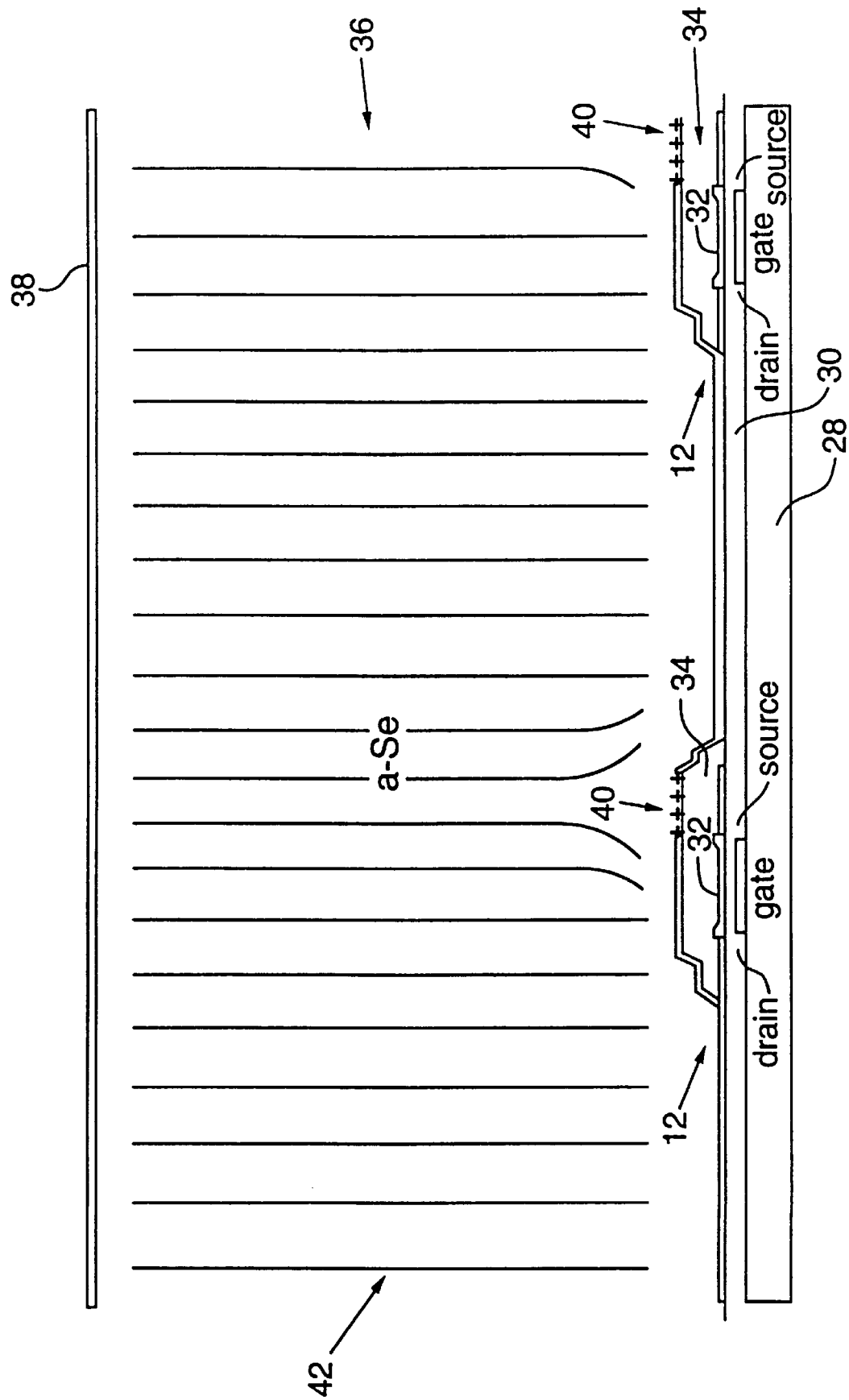
FIG. 4C shows an alternative embodiment in which fill factor is improved by the bending of electric field lines using the charge trapping properties of the top dielectric material between pixel electrodes.

With reference to FIG. 4C, instead of utilizing a grid to bend the field, as in the embodiment of FIGS. 4A and 4B, the charge trapping properties of the top dielectric material of the pixel electrodes may be utilized to bend the electric field. More particularly, after the construction of the detector is completed, a seasoning process is performed. To perform this seasoning, the detector is exposed to large doses of X-rays (or visible light if the top bias electrode 38 is semitransparent, e.g. Au), with the TFTs 16 all turned on and with an electric field applied to the selenium photoconductor 36. The holes created in the photoconductor 36 are drawn to the bottom surface thereof, either landing on the pixel electrodes 12 or becoming trapped by the dielectric material 34 between pixel electrodes. Holes which land on the pixel electrodes 12 are drained away through the turned-on TFTs 16 and the holes trapped at the insulator 34 generate a surface potential which increases with the number of holes trapped. When the potential rises to a level wherein further holes are repelled from the insulator, the system has reached equilibrium. Since the trapping of holes is a long term effect, when the detector is used for imaging after this stage, X-ray created holes will prefer to land on the pixel electrodes 12 and the effective fill-factor of the system is thereby increased to nearly 100%. This seasoning process may be performed once after the detector is constructed, or may be performed at the beginning of each day during which imaging is expected to be performed. It is further contemplated that repeated seasoning may not be necessary after long term usage of the device since the dark current of selenium may be enough to perform hole repelling after a sufficient term of use.

According to a further aspect of the present invention, means for measuring X-ray exposure dosages may be incorporated into the design of the active matrix flat panel detector so as to perform photo timing functions simultaneously with image detection.

Figure 5:
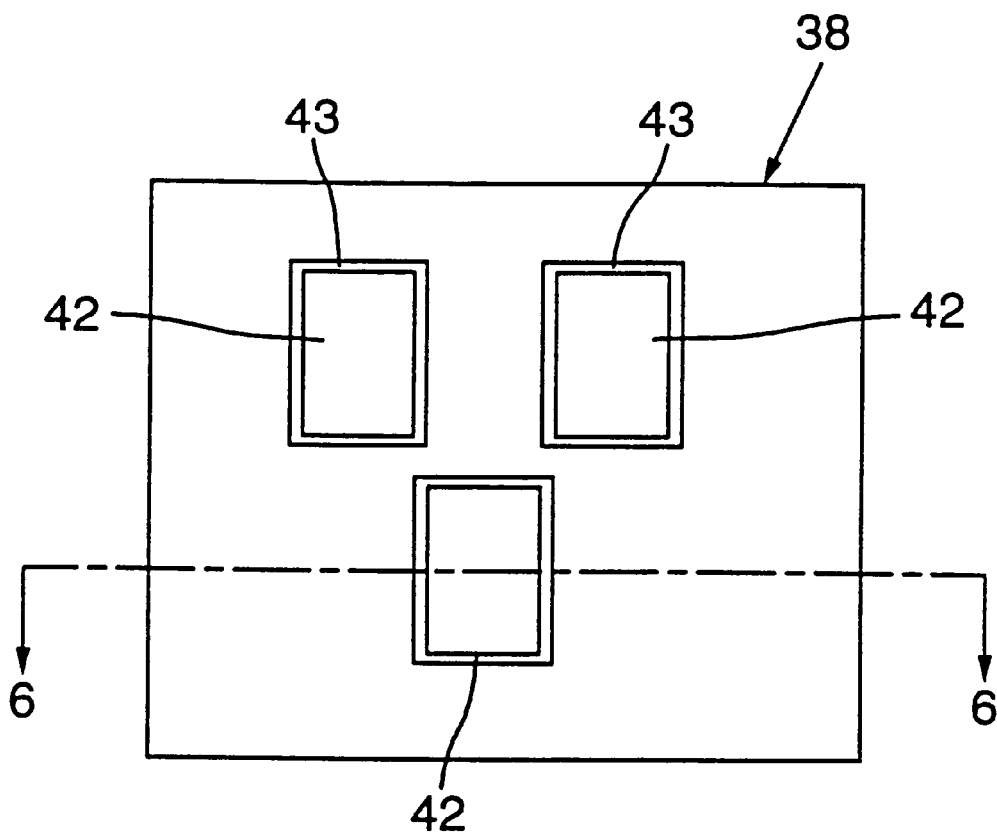
FIG. 5 is a plan view of an arrangement of bias electrode for biasing a photoconductor layer of the preferred embodiment and providing dose measurements in accordance with an alternative embodiment.

FIG. 5 shows the top view of top sensor bias electrode 38 which, as discussed above, is connected to a high voltage power supply. A plurality of smaller electrodes 42 (e.g. preferably 3 for chest radiography) provide regions of X-ray dose measurement.

Figure 7:
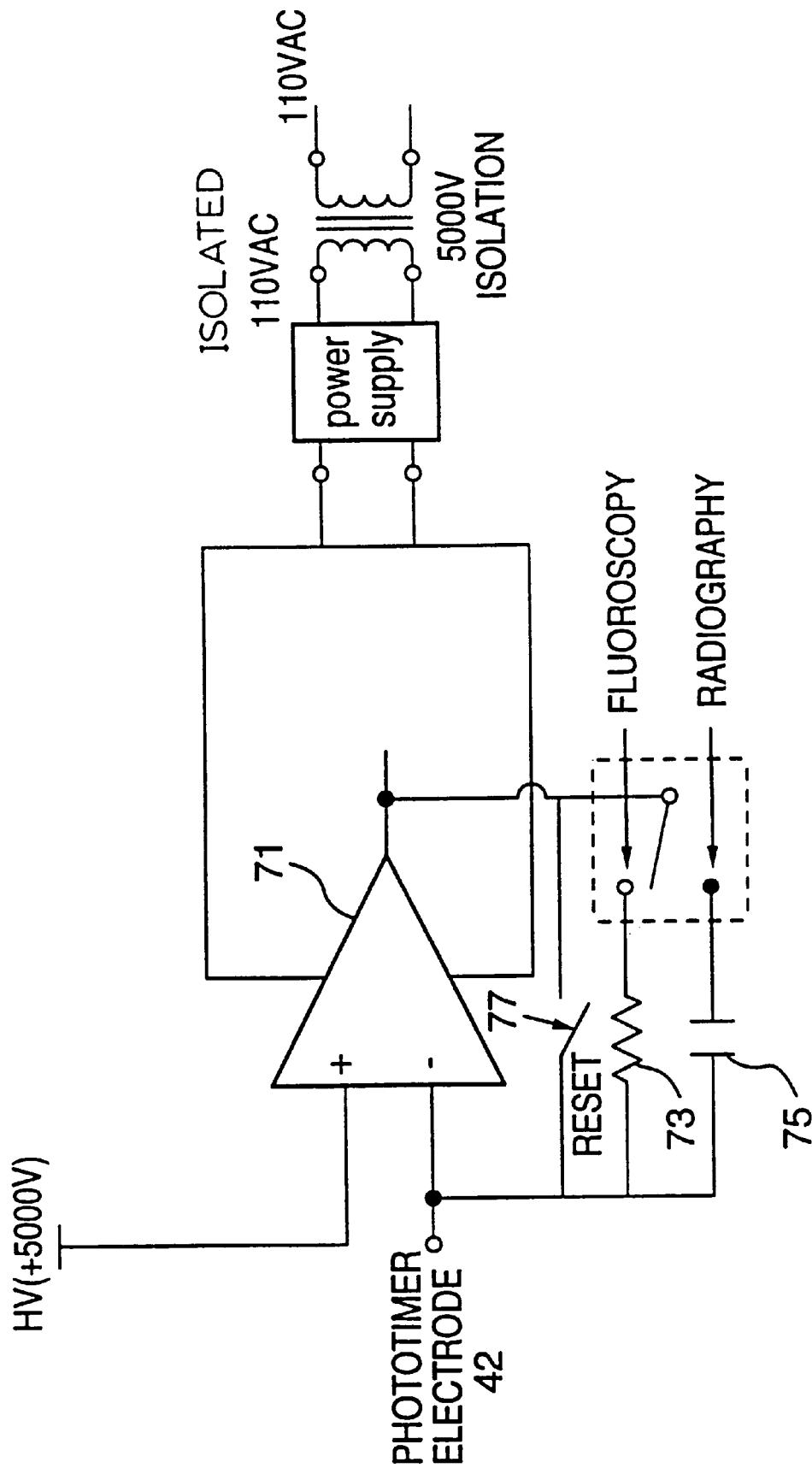
FIG. 7 is a schematic of a photo-timer and circuit arrangement for dose/dose rate measurement, according to the embodiment of FIGS. 5 and 6.

The bias electrode 38 is connected to a DC high voltage (HV) power supply. Each phototimer electrode 42 is connected to its own dose/dose rate measurement circuit. As shown in FIG. 7, each electrode 42 is connected to the inverting input of an amplifier 71 which is powered by a pair of isolated power supplies, for providing +15 V and –15 V with the ground reference set at the DC HV bias potential applied to the photoconductor 36. The inverting input of amplifier 71 is at the same potential as its non-inverting input, which is connected to the DC HV bias. Therefore, electrode 42 is at the same potential as electrode 38. When X-rays are absorbed by the photoconductor 36, current generated in the region of the phototimer flows to the amplifier 71 (since a closed loop circuit is provided by the storage capacitors 14 and $C_{GD}$). In the case of fluoroscopy, the X-ray generated current is measured with a feed-back resistor 73 at the amplifier, resulting in an output voltage signal which is, in turn, measured by a circuit in the X-ray generator (not shown) to determine whether it is the expected value and therefore whether to change the X-ray tube current. In the case or radiography, the photocurrent generated during a short pulse (a fraction of a second) of X-ray exposure is integrated by the feedback capacitor 75 of the amplifier. When the amplifier 71 output voltage (also monitored by a circuit in the X-ray generator) reaches a preset value (i.e. proportional to the preset X-ray exposure dosage), the X-ray generator will turn off the X-rays.

The imaging mode (fluoroscopy or radiography) is selected electronically by a relay 77. Since the relay 77 is connected to the amplifier circuit, it has to be operated by a control signal with the same reference (i.e. DC HV potential).

Figure 6A:
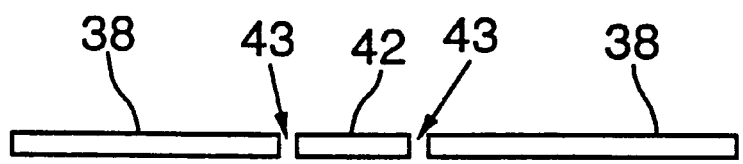
FIGS. 6A and 6B are two alternative cross-sectional views through the line VI—VI in FIG. 5.
Figure 6B:
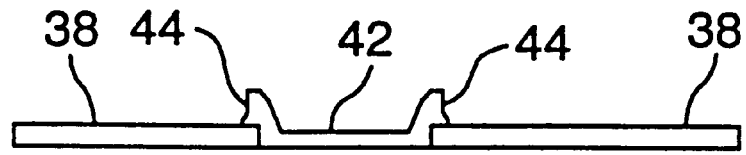

In the cross sectional view of the FIG. 6A embodiment, a gap 43 is provided for isolating the phototimer bias electrodes 42 from the common top bias electrode 38, whereas in the cross-sectional view of the FIG. 6B embodiment no gap for electric field application is shown (when viewed in plan), and the necessary isolation between electrodes is provided by an additional insulation layer 44.

Other embodiments and variations of the invention are possible. All such modifications and variations are believed to be within the sphere and scope of the invention as defined by the claims appended hereto.

The embodiments of the invention in which an exclusive property of privilege is claimed are defined as follows:

1. An active matrix imager, comprising:
   a) an array of thin film transistors disposed in a plurality of rows and columns, each of said transistors having a control terminal and a pair of signal terminals;
   b) a dielectric layer overlying each of said thin film transistors;
   c) scanning control circuit means having a plurality of control lines, respective ones of said control lines being connected to the control terminals of each of the thin film transistors in respective ones of said rows;
   d) read out circuit means having a plurality of data lines, respective ones of said data lines being connected to a first one of said pair of signal terminals of each of the thin film transistors in respective ones of said columns;
   e) a plurality of pixel electrodes respectively connected to a second one of said pair of signal terminals of each of the thin film transistors in said array of thin film transistors;
   f) a plurality of storage capacitors connected to respective ones of said pixel electrodes;
   g) a photoconductive layer overlying said plurality of pixel electrodes and said dielectric layer, wherein electron-hole pairs are created in response to exposing said photoconductive layer to radiation;
   h) a bias electrode overlying said photoconductive layer;
   i) first voltage means for establishing a high voltage difference between said bias electrode and respective ones of said pixel electrodes, whereby charges created by said electron-hole pairs are collected on respective ones of said pixel electrodes and stored on respective ones of said storage capacitors, the amount of said collected charges being proportional to intensity of said radiation exposure; and
   j) means overlying said first one of said pair of signal terminals of each of the thin film transistors in respective ones of said columns for establishing an electric field for repelling said charges in the vicinity of said first one of said pair of signal terminals toward said pixel electrodes, wherein said means overlying said first one of said pair of signal terminals of each of the thin film transistors further comprises a plurality of grid lines connected to a source of opposite polarity voltage to said bias electrode.

2. An active matrix imager, comprising:
   a) an array of thin film transistors disposed in a plurality of rows and columns, each of said transistors having a control terminal and a pair of signal terminals;
   b) a dielectric layer overlying each of said thin film transistors;
   c) scanning control circuit means having a plurality of control lines, respective ones of said control lines being connected to the control terminals of each of the thin film transistors in respective ones of said rows;
   d) read out circuit means having a plurality of data lines, respective ones of said data lines being connected to a first one of said pair of signal terminals of each of the thin film transistors in respective ones of said columns;
   e) a plurality of pixel electrodes respectively connected to a second one of said pair of signal terminals of each of the thin film transistors in said array of thin film transistors;
   f) a plurality of storage capacitors connected to respective ones of said pixel electrodes;
   g) a photoconductive layer overlying said plurality of pixel electrodes and said dielectric layer, wherein electron-hole pairs are created in response to exposing said photoconductive layer to radiation;
   h) a bias electrode overlying said photoconductive layer;
   i) first voltage means for establishing a high voltage difference between said bias electrode and respective ones of said pixel electrodes, whereby charges created by said electron-hole pairs are collected on respective ones of said pixel electrodes and stored on respective ones of said storage capacitors, the amount of said collected charges being proportional to intensity of said radiation exposure; and
   j) means overlying said first one of said pair of signal terminals of each of the thin film transistors in respective ones of said columns for establishing an electric field for repelling said charges in the vicinity of said first one of said pair of signal terminals toward said pixel electrodes, wherein said means overlying said first one of said pair of signal terminals of each of the thin film transistors further comprises a dielectric layer for absorbing said charges and thereby building up a repellent field to said charges over time.

3. The active matrix imager of claim 1, wherein each of said storage capacitors comprises a first electrode which is coterminous with said pixel electrode of an associated one of said thin film transistors, a second electrode which is coterminous with the control terminal of an adjacent one of said thin film transistors and a dielectric layer therebetween.

4. The active matrix imager of claim 1, wherein each of said storage capacitors comprises a first electrode which is coterminous with said pixel electrode, a second electrode connected to a separate ground return, and a dielectric layer therebetween.

5. The active matrix imager of claim 1, further comprising a plurality of radiation dosage detection regions in said bias electrode for receiving and collecting opposite ones of said charges created by said electron-hole pairs, and amplifier means connected to said radiation dosage detection regions for generating an output signal representing cumulative exposure of the imager to said radiation.

6. An active matrix imager, comprising:
a) an array of thin film transistors disposed in a plurality of rows and columns, each of said transistors having a first control terminal and a pair of signal terminals;
b) a dielectric layer overlying each of said thin film transistors;
c) scanning control circuit means having a plurality of control lines, respective ones of said control lines being connected to the control terminals of each of the thin film transistors in respective ones of said rows;
d) read out circuit means having a plurality of data lines, respective ones of said data lines being connected to a first one of said pair of signal terminals of each of the thin film transistors in respective ones of said columns;
e) a plurality of pixel electrodes respectively connected to a second one of said pair of signal terminals of each of the thin film transistors in said array of thin film transistors;
f) a plurality of storage capacitors connected to respective ones of said pixel electrodes;
g) a photoconductive layer overlying said plurality of pixel electrodes and said dielectric layer, wherein electron-hole pairs are created in response to exposing said photoconductive layer to radiation;
h) a bias electrode overlying said photoconductive layer;
i) first voltage means for establishing a high voltage difference between said bias electrode and respective ones of said pixel electrodes, whereby charges created by said electron-hole pairs are collected on respective ones of said pixel electrodes and stored on respective ones of said storage capacitors, the amount of said collected charges being proportional to intensity of said radiation exposure; and
j) a further control terminal opposite said first control terminal of each of said thin film transistors, each said further control terminal forming an extension of a respective one of said pixel electrodes such that for a predetermined thickness of said dielectric layer each of said thin film transistors remains enabled in the event of a pixel voltage in excess of a predetermined amount irrespective of a disable voltage being applied to said first control terminal, thereby providing protection of said thin film transistors against excessively high pixel voltages.

7. The active matrix imager of claim 6, wherein each of said storage capacitors comprises a first electrode which is coterminous with said pixel electrode of an associated one of said thin film transistors, a second electrode which is coterminous with the control terminal of an adjacent one of said thin film transistors and a dielectric layer therebetween.

8. The active matrix imager of claim 6, further comprising a plurality of radiation dosage detection regions in said bias electrode for receiving and collecting opposite ones of said charges created by said electron-hole pairs, and amplifier means connected to said radiation dosage detection regions for generating an output signal representing cumulative exposure of the imager to said radiation.

9. An active matrix imager, comprising:
a) an array of thin film transistors disposed in a plurality of rows and columns, each of said transistors having a first control terminal and a pair of signal terminals;
b) a dielectric layer overlying each of said thin film transistors;
c) scanning control circuit means having a plurality of control lines, respective ones of said control lines being connected to the control terminals of each of the thin film transistors in respective ones of said rows;
d) read out circuit means having a plurality of data lines, respective ones of said data lines being connected to a first one of said pair of signal terminals of each of the thin film transistors in respective ones of said columns;
e) a plurality of pixel electrodes respectively connected to a second one of said pair of signal terminals of each of the thin film transistors in said array of thin film transistors;
f) a plurality of storage capacitors connected to respective ones of said pixel electrodes;
g) a photoconductive layer overlying said plurality of pixel electrodes and said dielectric layer, wherein electron-hole pairs are created in response to exposing said photoconductive layer to radiation;
h) a bias electrode overlying said photoconductive layer;
i) first voltage means for establishing a high voltage difference between said bias electrode and respective ones of said pixel electrodes, whereby charges created by said electron-hole pairs are collected on respective ones of said pixel electrodes and stored on respective ones of said storage capacitors, the amount of said collected charges being proportional to intensity of said radiation exposure;
j) a plurality of radiation dosage detection regions in said bias electrode for receiving and collecting opposite ones of said charges created by said electron-hole pairs; and
k) amplifier means connected to said radiation dosage detection regions for generating an output signal representing cumulative exposure of the imager to said radiation.

10. The active matrix imager of claim 9, further comprising a gap intermediate said radiation dosage detection regions and said bias electrode for providing electrical isolation therebetween.

11. The active matrix imager of claim 9, further comprising an insulation layer intermediate said radiation dosage detection regions and said bias electrode for providing electrical isolation therebetween.

12. The active matrix imager of claim 9, further comprising a relay connected to an output and one input of said amplifier means, such that when said relay is closed a feedback path is provided between said output and said one input for effecting radiation dosage detection in an imaging mode of operating said imager, during either fluoroscopy or radiography.

13. The active matrix imager of claim 9, further comprising a resistor connected to an output and one input of said amplifier means, such that a feedback path is provided between said output and said one input for effecting radiation dosage detection in a fluoroscopy mode of operating said imager.

14. The active matrix imager of claim 9, further comprising a capacitor connected to an output and one input of said amplifier means, such that a feedback path is provided between said output and said one input for effecting radiation dosage detection in a radiography mode of operating said imager.

15. The active matrix imager of claim 9, wherein each of said storage capacitors comprises a first electrode which is coterminous with said pixel electrode of an associated one of said thin film transistors, a second electrode which is coterminous with the control terminal of an adjacent one of said thin film transistors and a dielectric layer therebetween.

16. The active matrix imager of claim 2, wherein each of said storage capacitors comprises a first electrode which is coterminous with said pixel electrode of an associated one of said thin film transistors, a second electrode which is coterminous with the control terminal of an adjacent one of said thin film transistors and a dielectric layer therebetween.

17. The active matrix imager of claim 2, wherein each of said storage capacitors comprises a first electrode which is coterminous with said pixel electrode, a second electrode connected to a separate ground return, and a dielectric layer therebetween.

18. The active matrix imager of claim 2, further comprising a plurality of radiation dosage detection regions in said bias electrode for receiving and collecting opposite ones of said charges created by said electron-hole pairs, and amplifier means connected to said radiation dosage detection regions for generating an output signal representing cumulative exposure of the imager to said radiation.

* * * * *